US012232257B2

(12) United States Patent
Sakai et al.

(10) Patent No.: US 12,232,257 B2
(45) Date of Patent: Feb. 18, 2025

(54) WIRING SUBSTRATE

(71) Applicant: IBIDEN CO., LTD., Gifu (JP)

(72) Inventors: Shunsuke Sakai, Ogaki (JP); Shuto Iwata, Ogaki (JP); Ikuya Terauchi, Ogaki (JP); Takahiro Yamada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 126 days.

(21) Appl. No.: 17/456,390

(22) Filed: Nov. 24, 2021

(65) Prior Publication Data
US 2022/0192018 A1    Jun. 16, 2022

(30) Foreign Application Priority Data

Dec. 15, 2020    (JP) .................................. 2020-207761

(51) Int. Cl.
*H05K 1/11*    (2006.01)
*H05K 1/18*    (2006.01)

(52) U.S. Cl.
CPC .............. *H05K 1/111* (2013.01); *H05K 1/116* (2013.01); *H05K 1/18* (2013.01); *H05K 2201/096* (2013.01); *H05K 2201/09609* (2013.01)

(58) Field of Classification Search
CPC .. H05K 1/111; H05K 1/116; H05K 2201/096; H05K 2201/09609; H05K 2201/099
See application file for complete search history.

(56) References Cited

U.S. PATENT DOCUMENTS 5,313,021 A * 5/1994 Sajja .................... H05K 3/3452
174/258
6,228,466 B1 * 5/2001 Tsukada ............ H01L 23/49816
428/209

(Continued)

FOREIGN PATENT DOCUMENTS

CN    104270887 A *   1/2015
JP    2004-022713 A    1/2004

(Continued)

OTHER PUBLICATIONS

English translation (machine) of JP2005209845A, published Aug. 2005.*

(Continued)

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes an insulating layer, a conductor layer formed on the insulating layer and including a conductor pad having a rectangular planar shape, and a solder resist layer formed on the insulating layer such that the solder resist layer is covering the conductor layer formed on the insulating layer. The solder resist layer has an opening formed such that the opening is exposing 50% or more of an area of a surface of the conductor pad on the opposite side with respect to the insulating layer and exposing a side surface and the surface of the conductor pad at side portions of a peripheral edge of the conductor pad and that the solder resist layer is covering the side surface and the surface of the conductor pad at one or more of corner portions of the peripheral edge of the conductor pad.

20 Claims, 6 Drawing Sheets

(56) References Cited

U.S. PATENT DOCUMENTS

| | | | |
|---|---|---|---|
| 7,271,484 B2* | 9/2007 | Reiss | B23K 3/0638 |
| | | | 257/738 |
| 2002/0071935 A1* | 6/2002 | Wu | H05K 1/111 |
| | | | 257/E23.021 |
| 2005/0082686 A1* | 4/2005 | Liu | H05K 3/3442 |
| | | | 257/780 |

FOREIGN PATENT DOCUMENTS

| | | | | |
|---|---|---|---|---|
| JP | 2005209844 A | * | 8/2005 | |
| JP | 2005209845 A | * | 8/2005 | |

OTHER PUBLICATIONS

English translation (machine) of CN104270887A. Published Jan. 2015.*

English Translation (machine) or JP2005209844A), 2005.*

* cited by examiner

WIRING SUBSTRATE

CROSS-REFERENCE TO RELATED APPLICATIONS

The present application is based upon and claims the benefit of priority to Japanese Patent Application No. 2020-207761, filed Dec. 15, 2020, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2004-22713 describes a multilayer wiring substrate having a pad part that is formed on an insulating layer and is bonded to a semiconductor element. A solder resist is provided on the insulating layer, and the pad part is formed in an opening of the solder resist in a state of being separated from the solder resist. The entire contents of this publication are incorporated herein by reference.

SUMMARY OF THE INVENTION

According to one aspect of the present invention, a wiring substrate includes an insulating layer, a conductor layer formed on the insulating layer and including a conductor pad having a rectangular planar shape, and a solder resist layer formed on the insulating layer such that the solder resist layer is covering the conductor layer formed on the insulating layer. The solder resist layer has an opening formed such that the opening is exposing 50% or more of an area of a surface of the conductor pad on the opposite side with respect to the insulating layer and exposing a side surface and the surface of the conductor pad at side portions of a peripheral edge of the conductor pad and that the solder resist layer is covering the side surface and the surface of the conductor pad at one or more of corner portions of the peripheral edge of the conductor pad.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
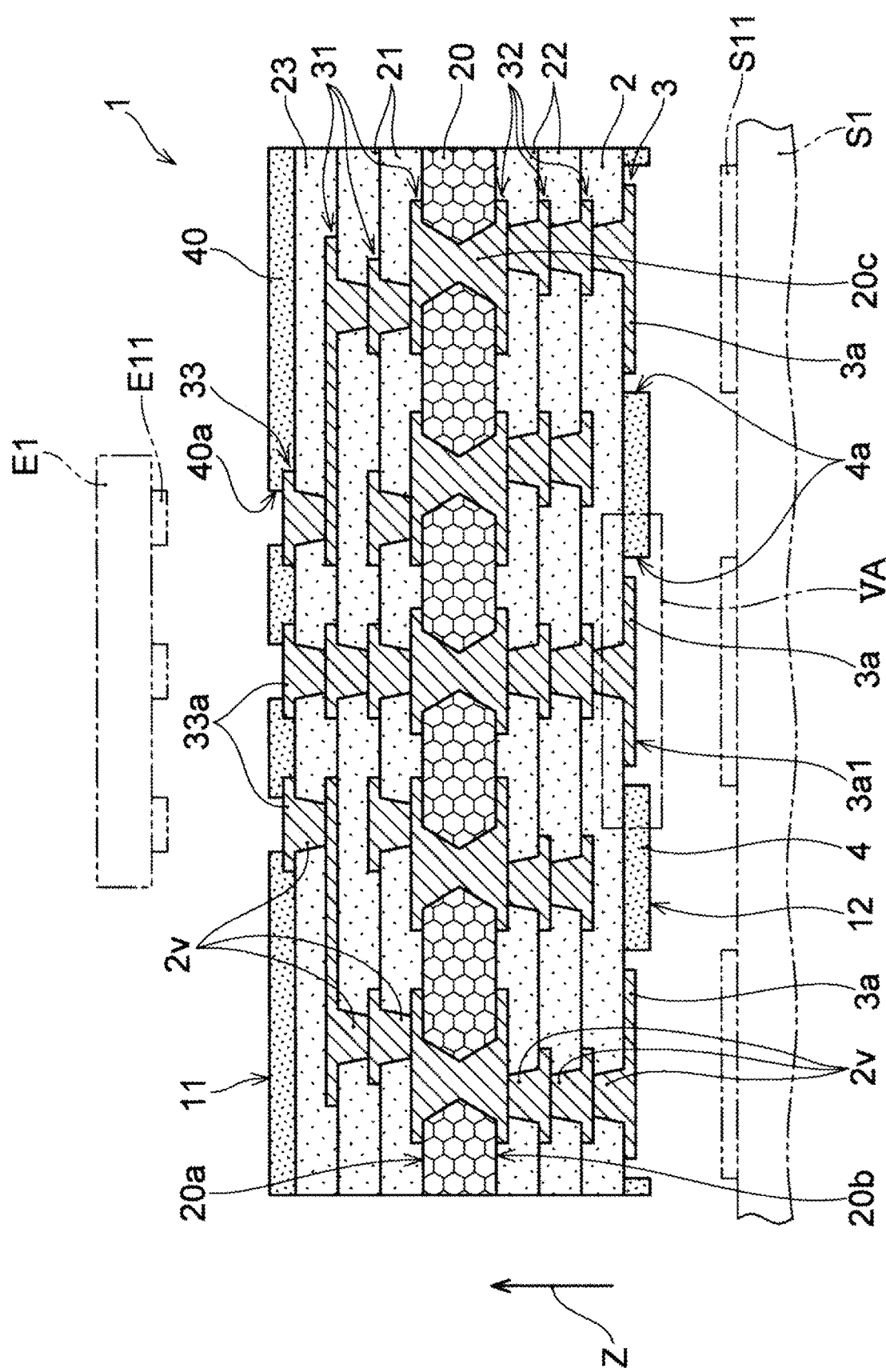
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
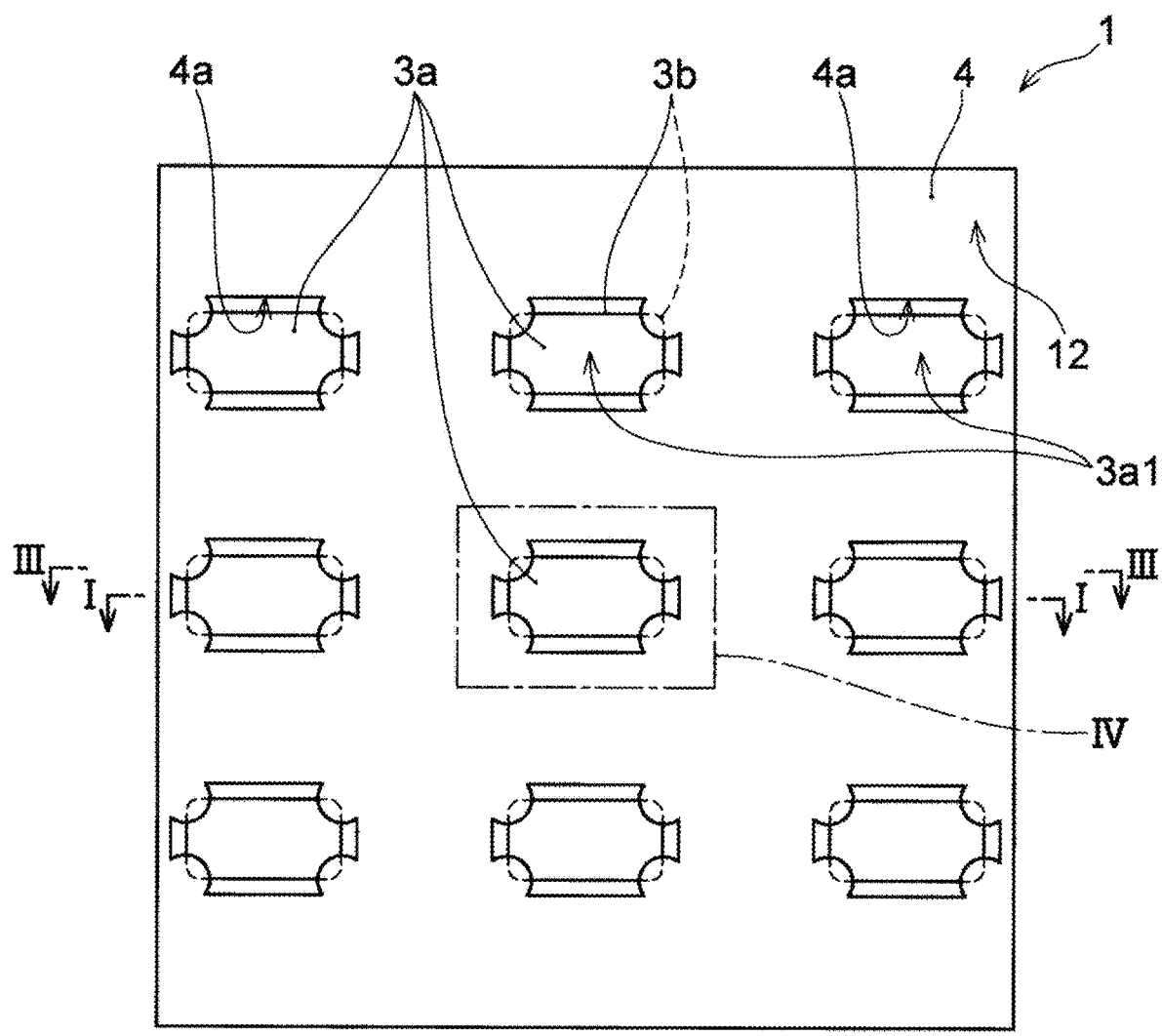
FIG. 2 is a plan view illustrating an example of a wiring substrate according to an embodiment of the present invention.
Figure 3:
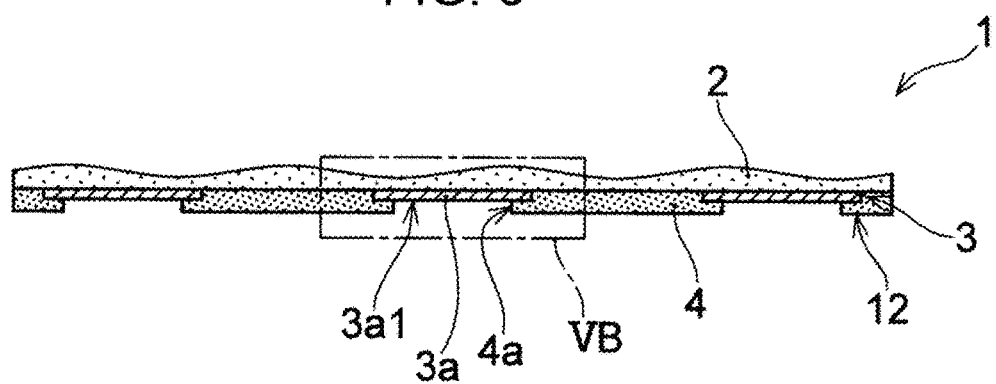
FIG. 3 is a cross-sectional view along a line (III-III) of the wiring substrate of FIG. 2.

A wiring substrate of an embodiment of the present invention is described with reference to the drawings. FIG. 1 illustrates a cross-sectional view of a wiring substrate 1, which is an example of the wiring substrate of the embodiment. FIG. 2 illustrates a plan view of the wiring substrate 1 from a lower surface side in FIG. 1. A cross-sectional view along an I-I line of FIG. 2 is FIG. 1. Further, a cross-sectional view along an III-III line of FIG. 2 is illustrated in FIG. 3. In FIG. 3, only a region near a lower surface of the wiring substrate 1 in FIG. 1 is illustrated, and the other regions are omitted.

As illustrated in FIG. 1, the wiring substrate 1 includes an insulating layer 20, and conductor layers and insulating layers that are alternately laminated on both sides of the insulating layer 20. On an upper surface (20a) of the insulating layer 20, three conductor layers 31 and two insulating layers 21 are alternately laminated, an insulating layer (second insulating layer) 23 is further laminated thereon, and a conductor layer (second conductor layer) 33 is formed on the insulating layer 23. Similarly, on a lower surface (20b) on the opposite side with respect to the upper surface (20a) of the insulating layer 20, three conductor layers 32 and two insulating layers 22 are alternately laminated, an insulating layer (first insulating layer) 2 is further laminated thereon, and a conductor layer (first conductor layer) 3 is formed on the insulating layer 2. A solder resist layer (second solder resist layer) 40 is formed on the insulating layer 23 and the conductor layer 33. A solder resist layer 4 is formed on the insulating layer 2 and the conductor layer 3. In this way, the wiring substrate 1 of the embodiment includes at least the insulating layer 2, the conductor layer 3 formed on the insulating layer 2, and the solder resist layer 4 formed on the insulating layer 2 and on the conductor layer 3, and in the example of FIG. 1, further includes the insulating layer 23 and the conductor layer 33.

The wiring substrate 1 has a first surface 11 and a second surface 12 on the opposite side with respect to the first surface 11, as two surfaces extending in a direction orthogonal to a thickness direction of the wiring substrate 1. The thickness direction of the wiring substrate 1 is also simply referred to as a "Z direction." In the wiring substrate 1, the insulating layer 23, the conductor layer 33, and the solder resist layer 40 are formed on the first surface 11 side of the wiring substrate 1, and form a surface layer part on the first surface 11 side of the wiring substrate 1. The first surface 11 is formed of exposed surfaces orthogonal to the Z direction of the insulating layer 23, the conductor layer 33, and the solder resist layer 40. Further, the insulating layer 2, the conductor layer 3, and the solder resist layer 4 are formed on the second surface 12 side of the wiring substrate 1, and form a surface layer part on the second surface 12 side of the wiring substrate 1. The second surface 12 is formed of exposed surfaces orthogonal to the Z direction of the insulating layer 2, the conductor layer 3, and the solder resist layer 4.

Through-hole conductors (20c) connecting the conductor layer 31 and the conductor layer 32 are formed in the insulating layer 20. The insulating layer 20, the conductor layer 31 on the upper surface (20a), and the conductor layer 32 on the lower surface (20b) form a core substrate of the wiring substrate 1. In the insulating layer 2 and the insulating layers (21-23), via conductors (2v) connecting the conductor layers sandwiching the insulating layer 2 and the insulating layers (21-23) are formed.

The insulating layer 2 and the insulating layers (20-23) are each formed using an insulating resin such as an epoxy resin, a bismaleimide triazine resin (BT resin) or a phenol resin. The insulating layers may each contain a reinforcing material (core material) such as a glass fiber and/or inorganic filler such as silica.

The conductor layer 3 and the conductor layers (31-33), the via conductors (2v), and the through-hole conductors (20c) are each formed using any metal such as copper or nickel, and are each formed of, for example, a metal foil such as a copper foil and/or a metal film formed by plating or sputtering or the like. Therefore, the conductor layer 3 and the conductor layers (31-33), the via conductors (2v), and the through-hole conductors (20c) are illustrated in FIG. 1 as each having a single-layer structure, but can each have a multilayer structure that includes two or more metal layers. For example, the conductor layer 31 and the conductor layer 32 that are respectively formed on the upper surface (20a) and the lower surface (20b) of the insulating layer 20 can each have a three-layer structure that includes a metal foil, an electroless plating film, and an electrolytic plating film. Further, the conductor layer 3, the conductor layer 33, the conductor layer 31 and the conductor layer 32 formed on the insulating layer 21 or the insulating layer 22, the via conductors (2v), and the through-hole conductors (20c) can each have a two-layer structure that includes, for example, an electroless plating film and an electrolytic plating film.

The conductor layers are patterned to have predetermined conductor pads and/or wiring patterns. In the wiring substrate 1 of the example of FIG. 1, the conductor layer 33 is patterned to have multiple component mounting pads (33a). That is, the wiring substrate 1 includes the multiple component mounting pads (33a) formed on the first surface 11. The multiple component mounting pads (33a) are formed on the insulating layer 23. The component mounting pads (33a) are conductor pads (second conductor pads) on surfaces of which a component (E1) mounted on the wiring substrate 1 is placed when the wiring substrate 1 is used. That is, the first surface 11 is a component mounting surface of the wiring substrate 1. Electrodes (E11) of the component (E1) are electrically and mechanically connected to the component mounting pads (33a) via a bonding material (not illustrated in the drawings) such as solder.

Examples of the component (E1) include electronic components such as an active component such as a semiconductor integrated circuit device or a transistor, and a passive component such as an electrical resistance. It is also possible that the component (E1) is a wiring material including fine wirings formed on a semiconductor substrate. However, the component (E1) is not limited to these.

In the present embodiment, the conductor layer 3 includes multiple conductor pads (3a) (first conductor pads). Therefore, the wiring substrate 1 has multiple conductor pads (3a) on the second surface 12. As illustrated in FIG. 2, the conductor pads (3a) each have a rectangular planar shape. A "planar shape" is a shape of an object such as a conductor pad (3a) in a plane view, and "in a plane view" means viewing the object with a line of sight parallel to the Z direction.

In the above and below description, "a rectangular shape" means a shape surrounded by two sides (line segments) that are parallel to each other and two sides (line segments) that are parallel to each other and orthogonal to the other two sides. In this "rectangular shape," two sides that are adjacent and orthogonal to each other do not necessarily have to connect to each other so as to form a right-angled intersection at the intersection, and a portion (corner) near the intersection may have a shape chamfered by C-chamfering or R-chamfering. In this case, a linear portion of each one side of the "rectangular shape" in the above and below description preferably has a length of ⅓ or more of a distance between the other two sides orthogonal to that one side. In each of the conductor pads (3a) in the example of FIG. 2, all four corner portions are R-chamfered.

In the wiring substrate 1 of the example of FIG. 1, similarly to the first surface 11, the second surface 12 may be a component mounting surface on which an electronic component such as a semiconductor integrated circuit device is mounted. Further, when the wiring substrate 1 itself is mounted on an external wiring substrate, for example, an external element (S1) such as a motherboard of any electrical device, the second surface 12 may be a connecting surface connected to the external element (S1). That is, for example, the wiring substrate 1 may form a part of a package of the component (E1) such as a semiconductor integrated circuit mounted on the first surface 11. In this case, as illustrated in FIG. 1, the wiring substrate 1 may be mounted on the external element (S1) together with the component (E1) with the second surface 12 facing the external element (S1).

When the second surface 12 is the connecting surface to the external element (S1), the second surface 12 can have connecting portions to the external element (S1). The wiring substrate 1 of the example of FIG. 1 is connected to the external element (S1) at the conductor pads (3a). Therefore, the conductor pads (3a) of the example of FIG. 1 are connection pads connected to the external element (S1) in the wiring substrate 1, and the connection pads to the external element (S1) in the wiring substrate 1 in FIG. 1 are formed of the conductor pads (3a).

The conductor pads (3a) can be electrically and mechanically connected to electrodes (S11) of the external element (S1) by a bonding member such as solder. As described above, the external element (S1) may be a motherboard of any electrical device, or may be any electronic component having a package size larger than that of the wiring substrate 1. Without being limited to these, the conductor pads (3a) can be connected to any substrate, electrical component, mechanical component, or the like.

In the example of FIG. 1, each of the conductor pads (3a) is larger than each of the multiple component mounting pads (33a) of the conductor layer 33 provided on the first surface 11 side. It is considered that the external element (S1), which is larger than the component (E1), and the wiring substrate 1 are firmly connected to each other with a large area.

The solder resist layers (4, 40) are each formed using, for example, an epoxy resin, a polyimide resin, or the like. The solder resist layer 40 has openings (40a) exposing the component mounting pads (33a). In the example of FIG. 1, the solder resist layer 40 covers peripheral edges of the component mounting pads (33a), and portions other than the peripheral edges of the component mounting pads (33a) are exposed in the openings (40a).

On the other hand, as illustrated in FIGS. 1-3, the solder resist layer 4 has openings (4a) exposing the conductor pads (3a). The openings (4a) expose 50% or more of an area of a main surface (3a1), which is a surface on the opposite side with respect to the insulating layer 2, of each of the conductor pads (3a). The openings (4a) may expose a majority of the main surface (3a1) of each of the conductor pads (3a). The conductor pads (3a) are exposed in the openings (4a) except for portions of peripheral edges of the conductor pads (3a). Therefore, the wiring substrate 1 and the external element (S1) can be firmly connected to each other with a large area.

In the present embodiment, peripheral edges (3b) of the conductor pads (3a) are partially exposed in the openings (4a) without being covered by the solder resist layer 4, as illustrated in FIGS. 1 and 2, and the peripheral edges (3b) of the conductor pads (3a) are partially covered by the solder resist layer 4 as illustrated in FIGS. 2 and 3.

Figure 4:
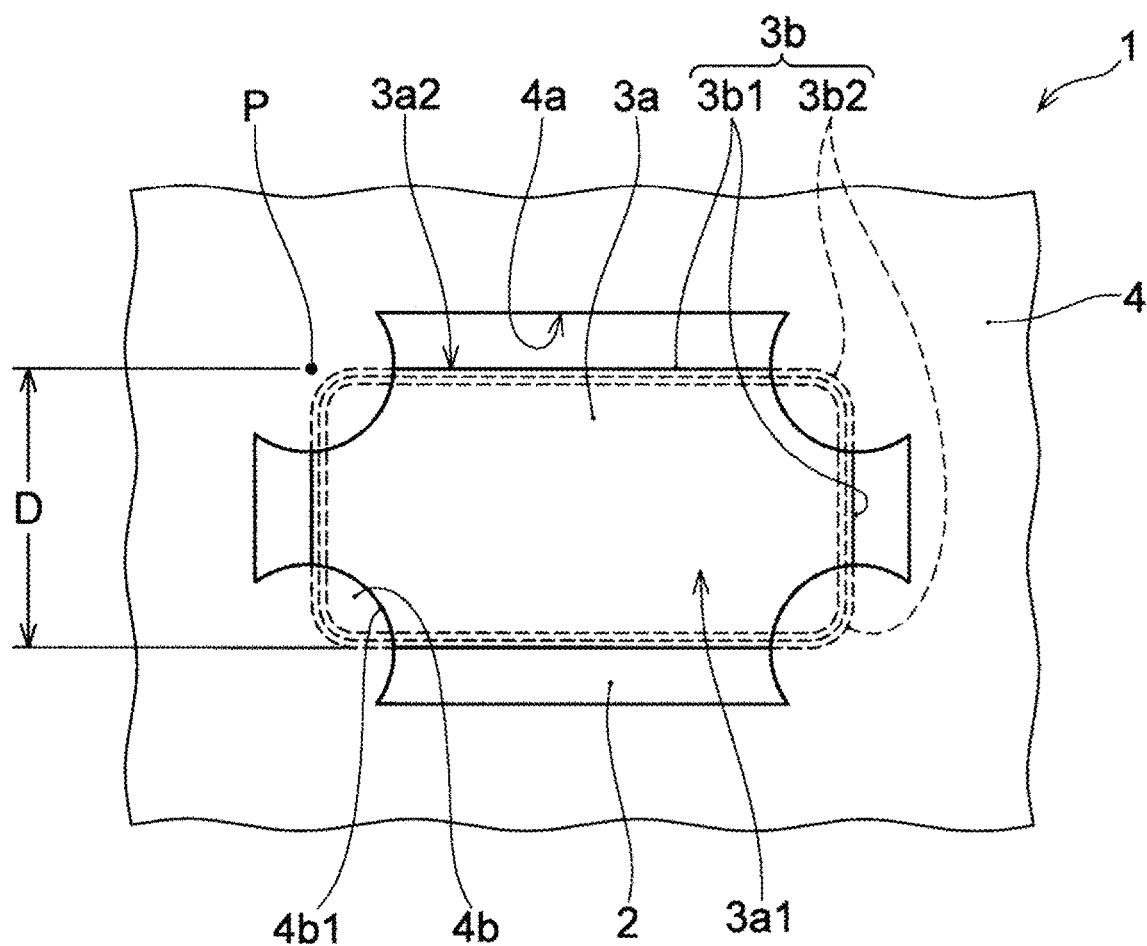
FIG. 4 is an enlarged view of a portion (IV) of FIG. 2.
Figure 5A:
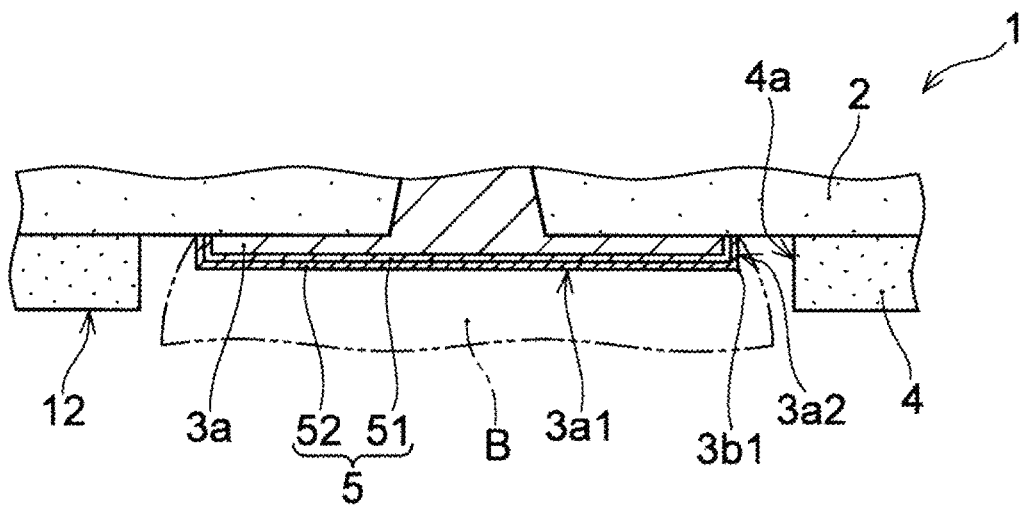
FIG. 5A is an enlarged view of a portion (VA) of FIG. 1.
Figure 5B:
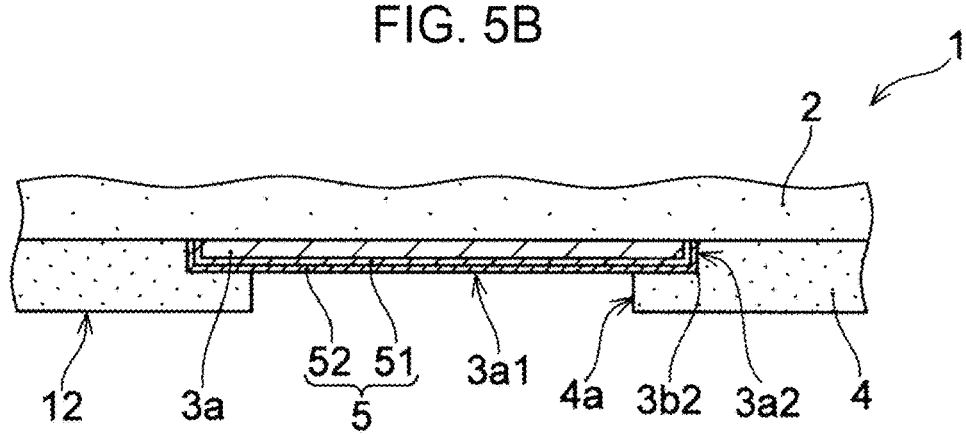
FIG. 5B is an enlarged view of a portion (VB) of FIG. 3.

With reference to FIGS. 4, 5A and 5B, the conductor pads (3a) and the openings (4a) of the solder resist layer 4 are further described. FIG. 4 illustrates an enlarged view of a portion (IV) of FIG. 2, FIG. 5A illustrates an enlarged view of a portion (VA) of FIG. 1, and FIG. 5B illustrates an enlarged view of a portion (VB) of FIG. 3. In FIGS. 5A and 5B, similar to FIG. 3, only a region near the second surface 12 of the wiring substrate 1 is illustrated, and the other regions are omitted.

As illustrated in FIGS. 4 and 5A, a side surface (3a2) and the main surface (3a1) of the conductor pad (3a) are exposed in the opening (4a) at side portions (3b1) of the peripheral edge (3b) of the conductor pad (3a) in a plan view. On the other hand, as illustrated in FIGS. 4 and 5B, the side surface (3a2) and the main surface (3a1) of the conductor pad (3a) are covered by the solder resist layer 4 at corner portions (3b2) of the peripheral edge (3b) of the conductor pad (3a) in a plan view.

In the present embodiment, in this way, since the peripheral edges (3b) of the conductor pads (3a) are covered by the solder resist layer 4 at the corner portions (3b2), it is considered that a crack in the insulating layer 2 or interfacial peeling or the like between the insulating layer 2 and the conductor pads (3a) is suppressed. On the other hand, since the peripheral edges (3b) of the conductor pads (3a) are exposed from the solder resist layer 4 at the side portions (3b1), it is considered that the conductor pads (3a) and the external element (S1) or the like illustrated in FIG. 1 are firmly connected.

That is, as described above, a stress may be generated in the conductor pads (3a) and the insulating layer 2 due to a difference in thermal expansion coefficient between the two or due to an external force. In this case, the stress is likely to be concentrated near the peripheral edges (3b) of the conductor pads (3a), which are boundaries between a region where the conductor pads (3a) are present and a region where the conductor pads (3a) are not present on the surface of the insulating layer 2. Then, the insulating layer 2 may be unable to withstand the concentrated stress, and a crack may occur in a portion overlapping the peripheral edges (3b) of the conductor pads (3a), or interface peeling may occur between the insulating layer 2 and the conductor pads (3a) starting from the peripheral edges (3b) of the conductor pads (3a). Such stress concentration may be more remarkable in curved portions than in linear portions of the peripheral edges (3b) of the conductor pads (3a). Therefore, it is considered that a crack or the like is more likely to occur at the corner portions (3b2) than at the side portions (3b1) of the peripheral edges (3b) of the conductor pads (3a).

On the other hand, in the present embodiment, since the conductor pads (3a) are covered by the solder resist layer 4 at the corner portions (3b2) of the peripheral edges (3b) of the conductor pads (3a), it is thought that a force acting on the insulating layer 2 is relaxed. For example, a stress caused by the presence of the conductor pads (3a) may be dispersed also on the solder resist layer 4 side, or a relative behavior of the conductor pads (3a) with respect to the insulating layer 2 may be restricted by the solder resist layer 4. As a result, in the present embodiment, it is considered that a defect such as a crack or interfacial peeling around the corner portions (3b2) of the conductor pads (3a) is suppressed.

In particular, in the wiring substrate 1 illustrated in FIGS. 1-5B, as described above, each of the conductor pads (3a) is larger than each of the multiple component mounting pads (33a) provided on the first surface 11 side. Therefore, the conductor pads (3a) each have a large planar area, and thus can each have a relatively large interface with respect to the insulating layer 2. Therefore, a stress concentrated on the peripheral edges (3b) is likely to become excessive. It is considered that the present embodiment is particularly beneficial for conductor pads each having a relatively large planar area such as the conductor pads (3a).

In this way, it is thought that a defect is suppressed by covering the peripheral edges (3b) of the conductor pads (3a) by the solder resist layer 4. However, when the entire peripheral edges (3b) are covered by the solder resist layer 4, an area of a connecting region with respect to an area of the conductor pads (3a) becomes small. The "connecting region" is a region of the entire surfaces of the conductor pads (3a) that contributes to connecting to an external element connected to the conductor pads (3a), and is a region of the main surfaces (3a1) and side surfaces (3a2) of the conductor pads (3a) that is not covered by the solder resist layer 4. When an area of the connecting region is small, a sufficient connection strength may not be obtained.

Therefore, in the present embodiment, the side surfaces (3a2) and the main surfaces (3a1) of the conductor pads (3a) are exposed in the openings (4a) at the side portions (3b1) of the peripheral edges (3b) of the conductor pads (3a). Therefore, as compared to a case where the entire peripheral edges (3b) are covered by the solder resist layer 4, a ratio of the connecting region to the area of the conductor pads (3a) can be increased. It is considered that necessary and sufficient connection strength can be easily obtained. In particular, since the side surfaces (3a2) of the conductor pads (3a) are also exposed at the side portions (3b1), as illustrated in FIG. 5A, also at the side surfaces (3a2), a bonding material (B) used for connecting to an external element and the conductor pads (3a) can be bonded. Therefore, not only a connection area is simply increased, but also a resistance to a force acting in a direction parallel to the main surfaces (3a1) of the conductor pads (3a) may be improved.

When the entire peripheral edges (3b) are covered by the solder resist layer 4 and large conductor pads (3a) are adopted to secure a sufficient connecting region, a high-density formation of the conductor pads (3a) or miniaturization of the wiring substrate 1 may be hindered. On the other hand, the conductor pads (3a) in the present embodiment are covered by the solder resist layer 4 at the corner portions (3b2) where a defect such as a crack is likely to occur, and are exposed in the openings (4a) at the side portions (3b1). Therefore, a sufficient connecting region may be secured while not hindering a high-density formation of the conductor pads (3a) and effectively suppressing a defect such as a crack.

In the present embodiment, a "corner portion" of a peripheral edge of a rectangular conductor pad is a portion within a specific length on each side from an intersection point of two adjacent sides (when the portion near the intersection point is chamfered, the intersection point is an intersection point of extension lines of the two sides, for example, a point (P) in FIG. 4). Further, a "side portion" is a portion other than a "corner portion" of a peripheral edge of a rectangular conductor pad. The "specific length" on each side is, for example, a length of ¼ of a distance (hereinafter, also referred to as a "distance (D)") between two sides orthogonal to the each side, and is preferably a length of 1/10 or more of the distance (D). When the two adjacent sides have different lengths, a portion within the "specific length" of the shorter side may be the "corner portion" of the two sides. For example, in FIG. 4, the corner portion (3b2) of the two sides sandwiching the point (P) is a portion within a length of ¼ of the distance (D) from the point (P) on each of the two sides. As illustrated in FIG. 4, the distance (D) is a distance between the two sides orthogonal to the shorter side (the vertical side in FIG. 4) of the two sides sandwiching the point (P).

When the conductor pads of the wiring substrate of the embodiment are chamfered at intersection points of the rectangles as in the conductor pad (3a) in the example of FIG. 4, the "corner portion" may be a chamfered portion, or may be the smaller of the portion within the "specific length" described above and the chamfered portion.

In the present embodiment, at least 50% or more of a corner portion (3b2) of each conductor pad (3a) is covered by the solder resist layer 4 on each of two sides that are adjacent to each other via the corner portion (3b2). Further, in the present embodiment, at least 50% or more of a side portion (3b1) of each of four sides of each conductor pad (3a) is exposed in an opening (4a) of the solder resist layer 4. Each side portion (3b1) of the peripheral edge (3b) of each conductor pad (3a) is preferably exposed in an opening (4a) of the solder resist layer 4 over a length of ⅓ or more of the above-described distance (D) of that side. Then, each conductor pad (3a) is preferably covered by the solder resist layer 4 at corner portions (3b2) on both sides of an exposed portion with a length of ¼ or more of the above-described "distance (D)." In that case, it is considered that a sufficient connecting region is secured and a defect near the peripheral edges (3b) of the conductor pads (3a) is likely to be suppressed. In the present embodiment, each corner portion (3b2) does not have to be entirely covered by the solder resist layer 4, and each side portion (3b1) does not have to be entirely exposed.

In the example of FIG. 4, the solder resist layer 4 covers the four corner portions (3b2) of the peripheral edge (3b) of each of the conductor pads (3a), that is, all of the corner portions (3b2) of the peripheral edge (3b). It is considered that a crack near the peripheral edges (3b) of the conductor pads (3a) can be prevented with a high probability. However, in the present embodiment, not all of the corner portions (3b2) of the peripheral edge (3b) of each of the conductor pads (3a) need to be covered by the solder resist layer 4. When at least one corner portion (3b2) is covered, a defect near the corner portion (3b2) can be suppressed.

Although omitted in FIGS. 1-3 referenced earlier, as illustrated in FIGS. 4-5B, the wiring substrate 1 includes a surface treatment layer 5 that covers the main surfaces (3a1) and the side surfaces (3a2) of the conductor pads (3a). The surface treatment layer 5 is a film formed by an anticorrosion treatment and/or a rust prevention treatment of exposed portions of the main surfaces (3a1) and the side surfaces (3a2) of the conductor pads (3a). The surface treatment layer 5 prevents corrosion, oxidation, or the like of the conductor pads (3a).

The surface treatment layer 5 is, for example, a metal film containing a metal different from the conductor pads (3a) or an organic film containing an organic substance such as an imidazole compound. When the conductor pads (3a) are formed of copper, the surface treatment layer 5 can be formed of nickel, palladium, silver, gold, or an alloy of these, or solder, or the like. In the example of FIGS. 4-5B, the surface treatment layer 5 has a two-layer structure including a lower layer 51 formed on the main body side of the conductor pads (3a) and an upper layer 52 formed on the lower layer 51. The lower layer 51 is, for example, a nickel film or an alloy film of nickel and palladium, and the upper layer is, for example, a metal film formed of gold.

When the surface treatment layer 5 is formed of a material having a thermal expansion coefficient between a thermal expansion coefficient of a material forming the main bodies of the conductor pads (3a) and a thermal expansion coefficient of the insulating layer 2, it is considered that a stress generated in the insulating layer 2 and the conductor pads 3 is reduced as compared to a case where the surface treatment layer 5 is not formed. Further, even when the surface treatment layer 5 is formed of a material having a larger difference in thermal expansion coefficient from the insulating layer 2 than from the conductor pads (3a), in the present embodiment, since the corner portions (3b2) of the conductor pads (3a) are covered by the solder resist layer 4, it is considered that a defect such as a crack is unlikely to occur.

In the example of FIG. 4, covering portions (4b) of the solder resist layer 4 covering the corner portions (3b2) of the conductor pads (3a) each have a bow shape or semicircular shape, which is a shape of a part of a circle. The covering portions (4b) each have a curved outer edge (4b1) that curves so as to be convex toward a center of a conductor pad (3a). Therefore, it is considered that a spot where a stress due to a difference in thermal expansion coefficient between the conductor pads (3a) and the solder resist layer 4 concentrates is unlikely to occur near the outer edges (4b1).

In the present embodiment, a shape of each of the conductor pads (3a) and a shape of each of the openings (4a) of the solder resist layer 4 are not limited to the shapes illustrated in FIG. 4 and the like. For example, FIGS. 6A-6C illustrate other examples of shapes of the conductor pads (3a) and the openings (4a) of the solder resist layer 4.

Figure 6A:
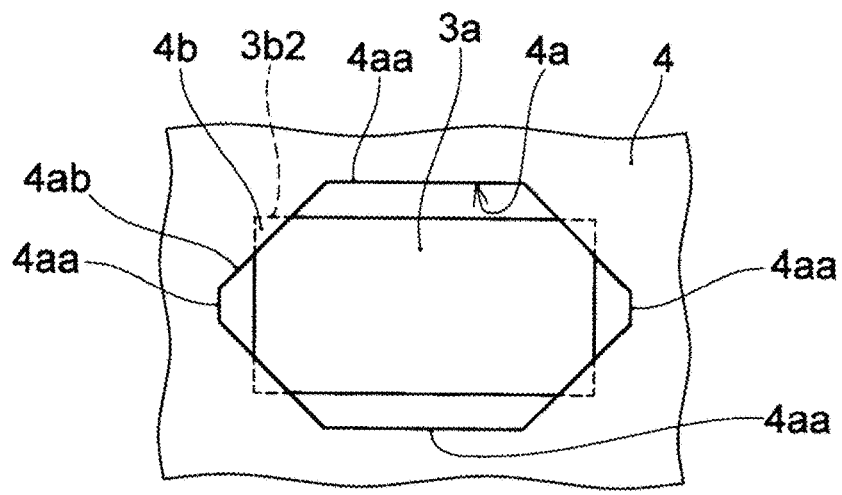
FIG. 6A is a cross-sectional view illustrating another example of a conductor pad and an opening of a solder resist layer according to an embodiment of the present invention.

In the example of FIG. 6A, none of the four vertices of the rectangular shape of each of the conductor pads (3a) are chamfered, and the two adjacent sides at each vertex connect to each other so as to form a right-angled intersection. The openings (4a) of the solder resist layer 4 each have an octagonal shape including four sides (4aa) that are respectively parallel to the sides of a conductor pad (3a). The solder resist layer 4 covers the unchamfered corner portions (3b2) of the conductor pads (3a) with the covering portions (4b). The covering portions (4b) each have a side (4ab)

between two adjacent sides of the four sides (4*aa*) of an opening (4*a*) as an outer edge. The covering portions (4*b*) each cover a corner portion (3*b*2) of a conductor pad (3*a*) so as to C-chamfer the corner portion (3*b*2) with the side (4*ab*) in a plan view.

Figure 6B:
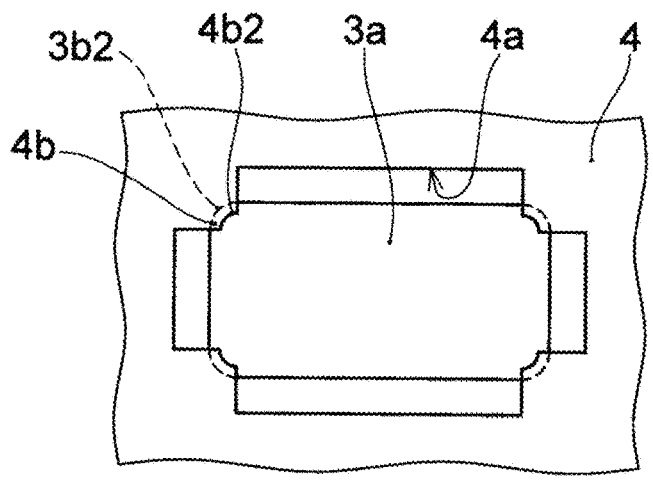
FIG. 6B is a cross-sectional view illustrating another example of a conductor pad and an opening of a solder resist layer according to an embodiment of the present invention.
Figure 6C:
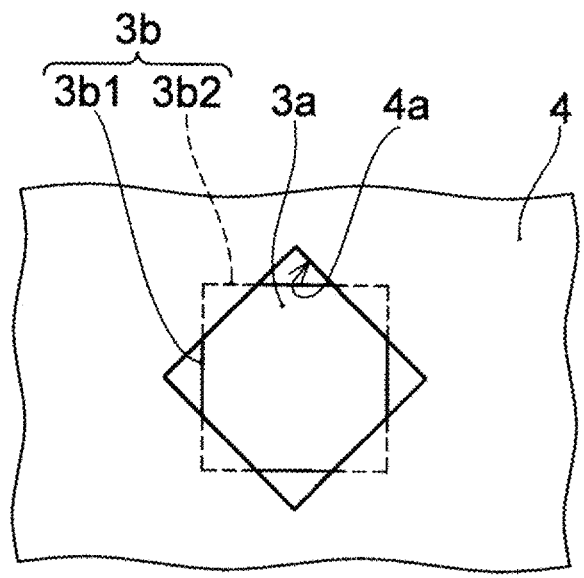
FIG. 6C is a cross-sectional view illustrating another example of a conductor pad and an opening of a solder resist layer according to an embodiment of the present invention.

Similar to the example of FIG. 4, in the example of FIG. 6B, the conductor pads (3*a*) have R-chamfered corner portions (3*b*2), and the solder resist layer 4 covers the corner portions (3*b*2) of the conductor pads (3*a*) with the covering portions (4*b*). However, in the example of FIG. 6B, the covering portions (4*b*) of the solder resist layer 4 each have a curved outer edge (4*b*2), and the outer edge (4*b*2) is curved along an outer edge of a corner portion (3*b*2) of a conductor pad (3*a*). Therefore, in the example of FIG. 6B, it is considered that a defect such as a crack near the corner portions (3*b*2) of the conductor pads (3*a*) is suppressed and a larger connecting region is secured.

In the example of FIG. 6C, the conductor pads (3*a*) and the openings (4*a*) of the solder resist 4 each have a square planar shape. Further, in the example of FIG. 6C, the conductor pads (3*a*) and the openings (4*a*) have substantially the same size in a plan view. Therefore, the openings (4*a*) and conductor pads (3*a*) have substantially the same shape and area in a plan view, and have congruent planar shapes. Further, a center of an opening (4*a*) and a center of a conductor pad (3*a*) overlap in a plan view, and the opening (4*a*) and the conductor pad (3*a*) overlap in a state of being tilted at an angle of 45 degrees with respect to each other. In the conductor pads (3*a*) and the openings (4*a*) of the solder resist layer 4 in the example of FIG. 6C, it is considered that a stress generated at the peripheral edge (3*b*) of each of the conductor pads (3*a*) is likely to be evenly distributed to the four side portions (3*b*1).

Figure 7A:
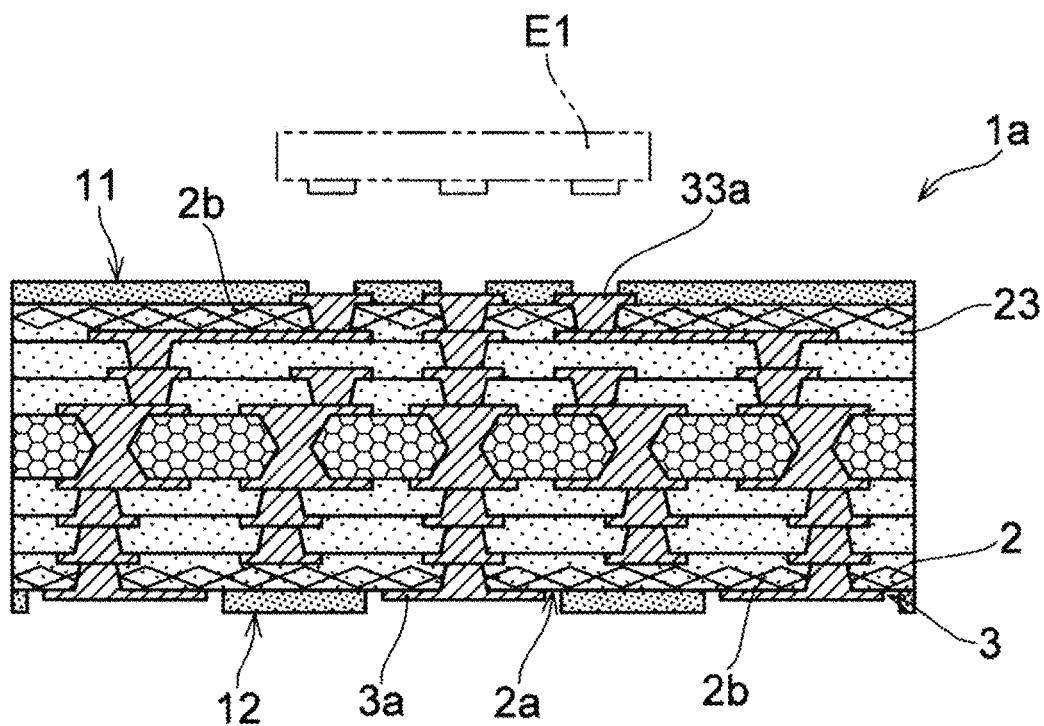
FIG. 7A is a cross-sectional view illustrating another example of a wiring substrate according to an embodiment of the present invention.
Figure 7B:
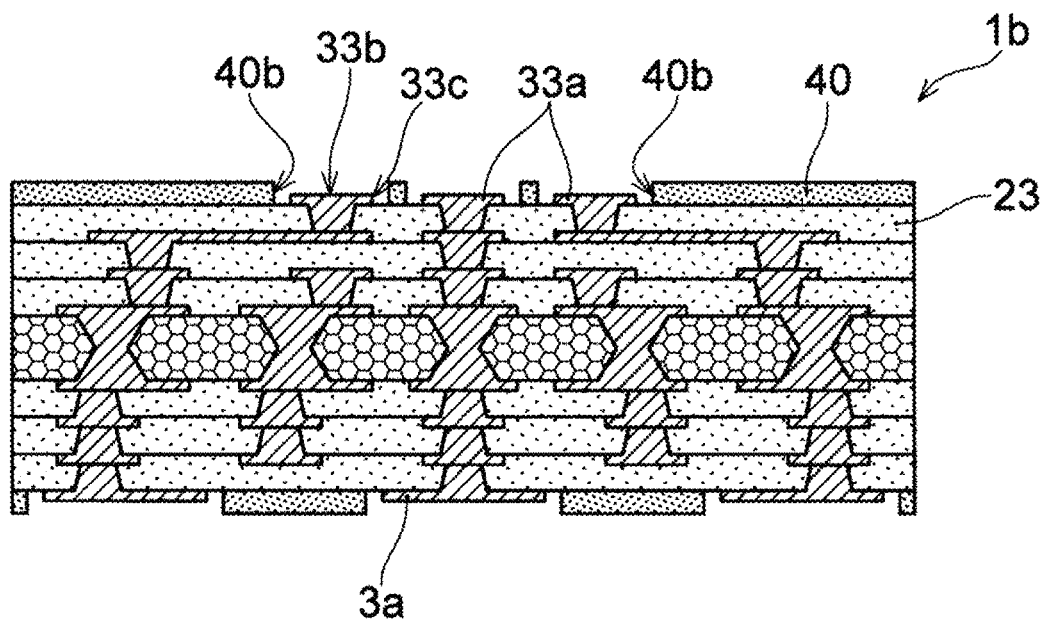
FIG. 7B is a cross-sectional view illustrating another example of a wiring substrate according to an embodiment of the present invention.

FIGS. 7A and 7B illustrate other examples of the wiring substrate of the embodiment. In the wiring substrate (1*a*) in the example of FIG. 7A, the insulating layer 2 that forms the surface layer part on the second surface 12 side of the wiring substrate (1*a*) contains a core material (2*b*). The core material (2*b*) is, for example, a glass fiber, an aramid fiber, an aramid non-woven fabric, or the like. However, the core material (2*b*) is not particularly limited as long as the core material (2*b*) can increase the strength of the insulating layer 2. The wiring substrate (1*a*) in the example of FIG. 7A has the same structure as the wiring substrate 1 of FIG. 1 except for the core material (2*b*). In FIG. 7A, a structural element that is the same as that in FIG. 1 is indicated using the same reference numeral symbol as the one used in FIG. 1 or is omitted as appropriate, and a description of the same structural element is omitted.

Since the insulating layer 2 of the wiring substrate (1*a*) of FIG. 7A contains the core material (2*b*), it is considered that the mechanical strength is higher than that of an insulating layer without a core material. Further, even when a crack that can be a starting point of a crack in the insulating layer 2 occurs in the insulating layer 2, its extension may be prevented by the core material (2*b*). Even when a crack occurs in the insulating layer 2 on a surface (2*a*) of which the conductor pads (3*a*) each having a relatively large area are formed, expansion of the crack may be suppressed, and a substantial defect may be avoided.

In the example of FIG. 7A, the insulating layer 23 (second insulating layer) that forms the surface layer part on the first surface 11 side of the wiring substrate (1*a*) also contains a core material (2*b*). It is considered that extension of a crack is also prevented in the insulating layer 23. The core material (2*b*) contained in the insulating layer 23 may be, for example, a glass fiber, an aramid fiber, an aramid non-woven fabric, or the like, and is not particularly limited to these. In the wiring substrate (1*a*), it is not always necessary for both the insulating layer 23 and the insulating layer 2 that respectively form the surface layer parts on the first surface 11 side and the second surface 12 side to contain the core material (2*b*). For example, it is also possible that only the insulating layer 2 on the second surface 12 side contains the core material (2*b*).

In the wiring substrate (1*b*) in the example of FIG. 7B, the peripheral edges of the multiple component mounting pads (33*a*) formed on the first surface 11 side are exposed in openings (40*b*) without being covered by the solder resist layer 40. Specifically, of the component mounting pads (33*a*), main surfaces (33*b*), which are surfaces on the opposite side with respect to the insulating layer 23 side, and side surfaces (33*c*) are exposed in the openings (40*b*). Although not illustrated in the drawings, in the example of FIG. 7B, similar to the corner portions (3*b*2) of the conductor pads (3*a*) illustrated in FIG. 4, the corner portions of the peripheral edges of the component mounting pads (33*a*) may be covered by the solder resist layer 40. Then, the main surfaces (33*b*) and the side surfaces (33*c*) of the component mounting pads (33*a*) may be exposed in the openings (40*b*) only at the side portions of the peripheral edges of the component mounting pads (33*a*) as illustrated in FIG. 7B. That is, in the wiring substrate of the embodiment, the conductor pads provided on both sides of the wiring substrate may be exposed from the solder resist layers at the side portions of the peripheral edges and covered by the solder resist layers at the corner portions.

Figure 8:
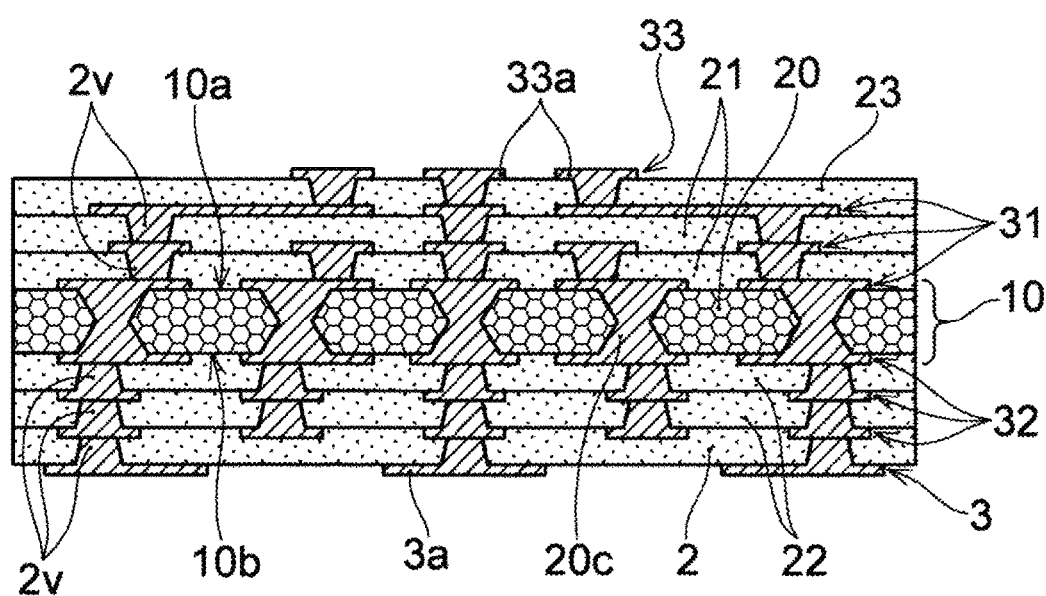
FIG. 8 is a cross-sectional view illustrating an example of a state of a wiring substrate according to an embodiment of the present invention during a manufacturing process.

A wiring substrate according to an embodiment may be manufactured using a common method for manufacturing a wiring substrate. With reference to FIG. 8, an example of a manufacturing method is outlined using a case where the wiring substrate 1 illustrated in FIG. 1 is manufactured as an example. As illustrated in FIG. 8, a core substrate 10 is prepared, an insulating layer 21 is laminated on a one-surface (10*a*) side of the core substrate 10, and a conductor layer 31 is formed on the insulating layer 21. Similarly, an insulating layer 22 is laminated on the other surface (10*b*) side of the core substrate 10, and a conductor layer 32 is formed on the insulating layer 22. Then, on the both sides of the core substrate 10, lamination of an insulating layer and formation of a conductor layer are repeated, and the outermost insulating layer 23 and the outermost insulating layer 2 are respectively formed on the one-surface (10*a*) side and the other-surface (10*b*) side of the core substrate 10.

In the preparation of the core substrate 10, for example, a double-sided copper-clad laminate containing the insulating layer 20 is prepared. Then, the core substrate 10 is prepared using a subtractive method or the like to form the conductor layers (31, 32) including predetermined conductor patterns on the both sides of the insulating layer 20 and form the through-hole conductors (20*c*) in the insulating layer 20. The insulating layers (21, 22), and the conductor layers (31, 32) on the insulating layer 21 or the insulating layer 22 are each formed, for example, using a common method for manufacturing a build-up substrate. For example, the insulating layers are each formed by thermocompression bonding an epoxy resin on a film onto the core substrate 10 or onto an insulating layer and a conductor layer formed earlier. Further, the conductor layers are each formed using any method for forming a conductor pattern such as a semi-additive method or a full additive method, including plating resist formation and pattern plating, and the like. In the formation of the conductor layers using a method for forming a conductor pattern, such as a semi-additive method, the via conductors (2v) can be formed in the insulating layers.

As illustrated in FIG. 8, the conductor layer 33 is further formed on the insulating layer 23, and the conductor layer 3 is further formed on the insulating layer 2. The conductor layer 3 is formed using any method of forming a conductor pattern, such as a semi-additive method using a plating resist (not illustrated in the drawings) having appropriate opening patterns so as to include the conductor pads (3a). Similarly, the conductor layer 33 is formed using any method of forming a conductor pattern to include the component mounting pads (33a).

Then, as illustrated in FIG. 1, the solder resist layer 40 is formed on the insulating layer 23 and the conductor layer 33, and the solder resist layer 4 is formed on the insulating layer 2 and the conductor layer 3. The openings (4a) and the openings (40a) are respectively provided in the solder resist layers (4, 40). The solder resist layers (4, 40) are each formed by applying, spraying, or laminating, in a form of a film, a photosensitive epoxy resin or polyimide resin. Then, the openings (4a, 40a) are formed, for example, by exposure and development, or laser processing, or the like. The surface treatment layer 5 (see FIG. 5A) can be formed on the surfaces of the conductor pads (3a) exposed in the openings (4a), and on the surfaces of the component mounting pads (33a) exposed in the openings (40a). The surface treatment layer 5 can be formed on the surfaces of the conductor pads (3a) and on the surfaces of the component mounting pads (33a) by depositing a metal such as nickel, palladium, or gold by electroless plating, electroplating, or the like, or by applying a heat resistant organic material by spraying. Through the above processes, the wiring substrate 1 in the example of FIG. 1 is completed.

The wiring substrate of the embodiment is not limited to those having the structures illustrated in the drawings and those having the structures, shapes, and materials exemplified in the present specification. The wiring substrate of the embodiment can have any laminated structure. For example, the wiring substrate of the embodiment may be a coreless substrate that does not include a core substrate. The wiring substrate of the embodiment can include any number of conductor layers and any number of insulating layers. The wiring substrate of the embodiment may be a so-called double-sided substrate or single-sided substrate. It is also possible that the surface treatment layer 5 is not provided on the conductor patterns (3a). As described above, the conductor pads of which the corner portions of the peripheral edges are covered by the solder resist layer and of which the side portions of the peripheral edges are exposed in the openings of the solder resist layer may be provided on both surfaces of the wiring substrate or may be provided on only one of the two surfaces of the wiring substrate.

In a conductor pad formed on an insulating layer, such as the pad part described in Japanese Patent Application Laid-Open Publication No. 2004-22713, and the insulating layer as a lower layer of the connection pad, a stress may occur due to a difference in thermal expansion coefficient between the conductor pad and the insulating layer, or due to an external force applied from an external component connected to the conductor pad. Therefore, it is considered that a defect such as a crack or interfacial peeling between the insulating layer and the conductor pad due to the stress is likely to occur in the conductor pad and the insulating layer in a vicinity of the conductor pad.

A wiring substrate according to an embodiment of the present invention has a first surface and a second surface on the opposite side with respect to the first surface, and includes: a first insulating layer; a conductor layer formed on the first insulating layer; and a solder resist layer formed on the first insulating layer and on the conductor layer. The conductor layer includes a conductor pad having a rectangular planar shape. The solder resist layer has an opening that exposes 50% or more of an area of a main surface of the conductor pad, the main surface being a surface on the opposite side with respect to the first insulating layer. A side surface and the main surface of the conductor pad are exposed in the opening at side portions of a peripheral edge of the conductor pad, and the side surface and the main surface of the conductor pad are covered by the solder resist layer at corner portions of the peripheral edge.

According to an embodiment of the present invention, it may be possible to suppress occurrence of a defect in a peripheral portion while ensuring an exposed portion of a required size of a conductor pad provided in a wiring substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
an insulating layer;
a conductor layer formed on the insulating layer and including a conductor pad having a rectangular planar shape; and
a solder resist layer formed on the insulating layer such that the solder resist layer is covering the conductor layer formed on the insulating layer,
wherein the solder resist layer has an opening formed such that the opening is exposing 50% or more of an area of a surface of the conductor pad on an opposite side with respect to the insulating layer and that a side surface of the conductor pad and the surface of the conductor pad are entirely exposed except the side surface and surface of the conductor pad at at least one of corner portions of a peripheral edge of the conductor pad, and the solder resist layer is formed such that the solder resist layer has at least one covering portion covering the at least one of the corner portions of the conductor pad and that each of the corner portions has a curved outer edge.

2. The wiring substrate according to claim 1, wherein the solder resist layer is formed such that the solder resist layer is covering all of the corner portions of the peripheral edge of the conductor pad.

3. The wiring substrate according to claim 2, wherein the solder resist layer is formed such that the solder resist layer has the covering portions having outer edges covering the corner portions of the conductor pad respectively along outer edges of the corner portions of the conductor pad.

4. The wiring substrate according to claim 2, further comprising:
a surface treatment layer covering the conductor pad.

5. The wiring substrate according to claim 2, wherein the wiring substrate has a first surface side and a second surface side on an opposite side with respect to the first surface side such that the wiring substrate has a component mounting surface configured to mount a component thereon on the first surface side and that the conductor layer is formed on a second surface side.

6. The wiring substrate according to claim 5, wherein the conductor layer is formed such that the conductor pad is configured to be connected to an external element.

7. The wiring substrate according to claim 5, further comprising:
   a plurality of component mounting pads formed on the component mounting surface such that the conductor pad of the conductor layer is larger than each of the component mounting pads.

8. The wiring substrate according to claim 7, further comprising:
   a second solder resist layer formed on the component mounting surface and having a plurality of openings such that the second solder resist layer is covering peripheral edges of the component mounting pads, and that portions other than the peripheral edges of the component mounting pads are exposed in the openings of the second solder resist layer.

9. The wiring substrate according to claim 5, wherein the insulating layer includes a core material.

10. The wiring substrate according to claim 2, wherein the solder resist is formed such that the opening has a periphery that is substantially parallel to the periphery of the conductor pad at side portions of the conductor pad.

11. The wiring substrate according to claim 2, wherein the conductor layer is formed such that the corner portions of the conductor pad are R-chamfered.

12. The wiring substrate according to claim 1, further comprising:
   a surface treatment layer covering the conductor pad.

13. The wiring substrate according to claim 12, wherein the wiring substrate has a first surface side and a second surface side on an opposite side with respect to the first surface side such that the wiring substrate has a component mounting surface configured to mount a component thereon on the first surface side and that the conductor layer is formed on a second surface side.

14. The wiring substrate according to claim 1, wherein the wiring substrate has a first surface side and a second surface side on an opposite side with respect to the first surface side such that the wiring substrate has a component mounting surface configured to mount a component thereon on the first surface side and that the conductor layer is formed on a second surface side.

15. The wiring substrate according to claim 14, wherein the conductor layer is formed such that the conductor pad is configured to be connected to an external element.

16. The wiring substrate according to claim 14, further comprising:
   a plurality of component mounting pads formed on the component mounting surface such that the conductor pad of the conductor layer is larger than each of the component mounting pads.

17. The wiring substrate according to claim 16, further comprising:
   a second solder resist layer formed on the component mounting surface and having a plurality of openings such that the second solder resist layer is covering peripheral edges of the component mounting pads, and that portions other than the peripheral edges of the component mounting pads are exposed in the openings of the second solder resist layer.

18. The wiring substrate according to claim 1, wherein the insulating layer includes a core material.

19. The wiring substrate according to claim 1, wherein the conductor layer is formed such that the corner portions of the conductor pad are R-chamfered.

20. The wiring substrate according to claim 1, wherein the solder resist is formed such that the opening has a periphery that is substantially parallel to the periphery of the conductor pad at side portions of the conductor pad.

* * * * *